United States Patent
Iwasawa

(10) Patent No.: US 7,803,721 B2
(45) Date of Patent: Sep. 28, 2010

(54) SEMICONDUCTOR DEVICE AND METHOD OF MANUFACTURING SAME

(75) Inventor: Kazuaki Iwasawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 493 days.

(21) Appl. No.: 11/685,984

(22) Filed: Mar. 14, 2007

(65) Prior Publication Data
US 2007/0284649 A1 Dec. 13, 2007

(30) Foreign Application Priority Data
Mar. 27, 2006 (JP) ............................ P2006-085744

(51) Int. Cl.
*H01L 21/469* (2006.01)

(52) U.S. Cl. ........................ 438/787; 438/778; 438/789; 438/790; 438/906; 257/E21.228; 257/E21.263

(58) Field of Classification Search ................ 257/506, 257/510, 513, E29.063, E21.263, E21.228; 438/778, 787, 789, 790, 906
See application file for complete search history.

(56) References Cited

U.S. PATENT DOCUMENTS

| | | | | |
|---|---|---|---|---|
| 5,965,246 | A * | 10/1999 | Guiselin et al. | 428/212 |
| 6,358,785 | B1 * | 3/2002 | Chittipeddi et al. | 438/174 |
| 7,105,397 | B2 * | 9/2006 | Hieda et al. | 438/207 |
| 7,524,735 | B1 * | 4/2009 | Gauri et al. | 438/436 |
| 7,557,420 | B2 * | 7/2009 | Fucsko et al. | 257/499 |
| 2002/0115284 | A1 * | 8/2002 | Wu et al. | 438/637 |
| 2003/0060057 | A1 * | 3/2003 | Raaijmakers et al. | 438/770 |
| 2003/0205814 | A1 * | 11/2003 | Matsunaga et al. | 257/758 |
| 2005/0012171 | A1 * | 1/2005 | Hiyama et al. | 257/510 |
| 2006/0088951 | A1 * | 4/2006 | Hayashi et al. | 438/99 |
| 2007/0063258 | A1 * | 3/2007 | Violette | 257/315 |
| 2007/0218623 | A1 * | 9/2007 | Chua et al. | 438/240 |
| 2009/0081846 | A1 * | 3/2009 | Kawamoto et al. | 438/424 |
| 2009/0149012 | A1 * | 6/2009 | Brask et al. | 438/595 |

FOREIGN PATENT DOCUMENTS

JP 2005-243709 9/2005

OTHER PUBLICATIONS

U.S. Appl. No. 12/233,052, filed Sep. 18, 2008, Kawamoto et al.

* cited by examiner

*Primary Examiner*—Charles D Garber
*Assistant Examiner*—Eduardo A Rodela
(74) *Attorney, Agent, or Firm*—Oblon, Spivak, McClelland, Maier & Neustadt, L.L.P.

(57) ABSTRACT

A semiconductor device includes a deposited-type insulating film disposed on a substrate; a coating-type insulating film disposed on a surface of the deposited-type insulating film and having a film density which is lower than a film density of the deposited-type insulating film; and an intermediate insulating film disposed between the deposited-type insulating film and the coating-type insulating film and having a film density which is intermediate between the film density of the deposited-type insulating film and the film density of the coating-type insulating film.

7 Claims, 5 Drawing Sheets

SEMICONDUCTOR DEVICE AND METHOD OF MANUFACTURING SAME

CROSS REFERENCE TO RELATED APPLICATION

This application is based upon and claims the benefit of priority from the prior Japanese Patent Application No. 2006-85,744 filed on Mar. 27, 2006, the entire contents of which are incorporated by reference.

BACKGROUND OF THE INVENTION

1. Field of the Invention

This invention relates to a semiconductor device and a method of manufacturing same, and more particularly relates to a semiconductor device having an insulating film on a substrate and a method of manufacturing a semiconductor device having an insulating film on a substrate. Further, the present invention relates to a semiconductor device having an isolation region between cells and a method of manufacturing same, and more particularly to technology which is effective when applied to a semiconductor device having an isolation region between non-volatile memory cells which require high integration and a method of manufacturing same.

2. Description of the Related Art

High integration and increased storage capacity is being required for Electronically Erasable and Programmable Read Only Memories (EEPROMs). A non-volatile memory cell capable of storing data corresponding to the storage capacity of one bit of NAND type EEPROM is formed by a field effect transistor having a charge accumulation layer (a floating gate electrode). More specifically, a non-volatile memory cell includes a channel-forming region, a charge accumulation layer formed on the channel-forming region via a gate insulating film, a control electrode (a control gate electrode) formed on the charge accumulation layer via a gate insulating film, and source and drain regions.

In a memory cell array of a non-volatile memory device, a data line and a word line intersect with each other. A plurality of non-volatile memory cells, such as 8 memory cells, for example, have a common source region and a common drain region (These plural non-volatile memory cells are connecting with each other and are arranged in a sequence along the extending direction of the data line. These plural non-voltage memory cells form one byte. A non-volatile memory cell located at one end of the sequence is connected with the data line through a select gate and a non-volatile memory cell located at the other end of the sequence is connected with the source line directly or through a select gate. A control electrode of each of the plurality of cells is connected with each word line.

Information "0" or "1" is stored in a non-volatile memory cell depending on whether or not a charge (electron) is accumulated in the charge accumulation layer. In accordance with the information stored, whether or not a current flows between the source and drain regions is determined.

In order to achieve high integration and increased memory capacity of a NAND type EEPROM, it is significant to minimize the size of non-volatile memory cells. Here, it is inevitable to decrease the area of an isolation region between non-volatile memory cells which are adjacent to each other. Japanese Patent Laid-Open Publication No. 2005-243709 discloses a semiconductor device in which the area of the isolation region can be decreased by means of a combination of shallow trench isolation (STI) technique and film forming technique and a method of manufacturing the same.

Specifically, in the semiconductor device and the method of manufacturing the same disclosed in Japanese Patent Laid-Open Publication No. 2005-243709, the shallow trench isolation technique is employed to form a trench in a semiconductor substrate, and a silicon oxide film is buried within the trench. As this silicon oxide film, a silicon oxide film formed by High Density Plasma-Chemical Vapor Deposition (HDP-CVD) method and a silicon film which is coated by Spin On Glass method and converted and layered on the silicon film previously formed are employed.

In the semiconductor device and the method of manufacturing the same disclosed in Japanese Patent Laid-Open Publication No. 2005-243709, as an interval between adjacent non-volatile memory cells of a non-volatile memory device can be secured in the depth direction of a semiconductor substrate by means of the trench, the area of the isolation region can be decreased. Further, the silicon oxide film formed by HDP-CVD method has a dense film quality, and therefore has excellent resistance to leakage current. On the other hand, the silicon oxide film formed by spin-on-glass method has flowability when it is coated, and can therefore fill the interior of the trench to a sufficient degree even when the size of an opening of the trench is small. In particular, the former silicon oxide film is buried within the trench and simultaneously is formed so as to cover the surface of a charge accumulation layer of the non-volatile memory cell, whereby charge storage characteristics can be enhanced. Further, in the manufacturing process of a non-volatile memory device, a mask which is used for patterning the charge accumulation layer of a non-volatile memory cell is used for forming the trench, and therefore the aspect ratio between the height from the mask surface to the bottom of the trench and the size of the opening of the trench is large, so that the latter silicon oxide film can reliably fill the interior of the trench.

With the semiconductor device and the method of manufacturing the same as described above, however, no consideration has been taken concerning film separation and generation of cracks which occurs at an interface between the silicon oxide film having dense film quality formed by HDP-CVD method and the silicon oxide film formed by spin-on-glass method, resulting from film densities of these silicon oxide films.

BRIEF SUMMARY OF THE INVENTION

A first aspect of the embodiment of the invention relates to a semiconductor device having a deposited-type insulating film disposed on a substrate; a coating-type insulating film disposed on a surface of the deposited-type insulating film and having a film density which is lower than a film density of the deposited-type insulating film; and an intermediate insulating film disposed between the deposited-type insulating film and the coating-type insulating film and having a film density which is intermediate between the film density of the deposited-type insulating film and the film density of the coating-type insulating film.

A second aspect of the embodiment of the invention relates to a semiconductor device including an isolation region, having a trench provided from a surface of a substrate in the direction of a depth of the substrate; a deposited-type insulating film disposed on a surface of an inner wall of the trench; a coating-type insulating film disposed on a surface of the deposited-type insulating film and having a film density which is lower than a film density of the deposited-type insulating film; and an intermediate insulating film disposed between the deposited-type insulating film and the coating-type insulating film and having a film density which is intermediate between the film density of the deposited-type insulating film and the film density of the coating-type insulating film.

A third aspect of the embodiment of the invention relates to a semiconductor device, having a non-volatile memory cell which includes: a channel-forming region provided in a surface portion of a substrate; a first gate insulating film disposed on the channel-forming region; a charge accumulation layer disposed on the first gate insulating film; a second gate insulating film disposed on the charge accumulation layer; and a control electrode disposed on the second insulating film; and an isolation region which includes: trenches provided on the surface of the substrate so as to be opposed to each other with the channel-forming region being interposed therebetween and formed from the surface of the substrate in the direction of a depth of the substrate; a deposited-type insulating film disposed on a surface of an inner wall of the trench; a coating-type insulating film disposed on a surface of the deposited-type insulating film and having a film density which is lower than a film density of the deposited-type insulating film; and an intermediate insulating film disposed between the deposited-type insulating film and the coating-type insulating film and having a film density which is intermediate between the film density of the deposited-type insulating film and the film density of the coating-type insulating film.

A fourth aspect of the embodiment of the invention relates to a method of manufacturing a semiconductor device, the method including: depositing an insulating film on a substrate; coating an insulating film material in which polysilazane is dissolved on the insulating film; applying a heat treatment to the insulating film material to form a silicon oxide film; and applying a megasonic process to the silicon oxide film to decrease a residual stress of the silicon oxide film.

A fifth aspect of the embodiment of the invention relates to a method of manufacturing a semiconductor device, the method including: depositing a first insulating film on a substrate; forming a second insulating film on the first insulating film; coating an insulating film material in which polysilazane is dissolved on the second insulating film; and applying a heat treatment to the insulating film material to form a silicon oxide film, wherein the second insulating film has a film density which is intermediate between a film density of the first insulating film and a film density of the silicon oxide film.

BRIEF DESCRIPTION OF THE SEVERAL
VIEWS OF THE DRAWINGS

DETAILED DESCRIPTION OF THE INVENTION

Embodiments of the present invention will be described in detail with reference to the drawings. In the embodiments of the present invention, an example in which the present invention is applied to a NAND type EEPROM will be described, as a semiconductor device to which the present invention is applied most effectively.

[Configuration of Semiconductor Device, NAND type EEPROM, and Isolation Region]

Figure 1:
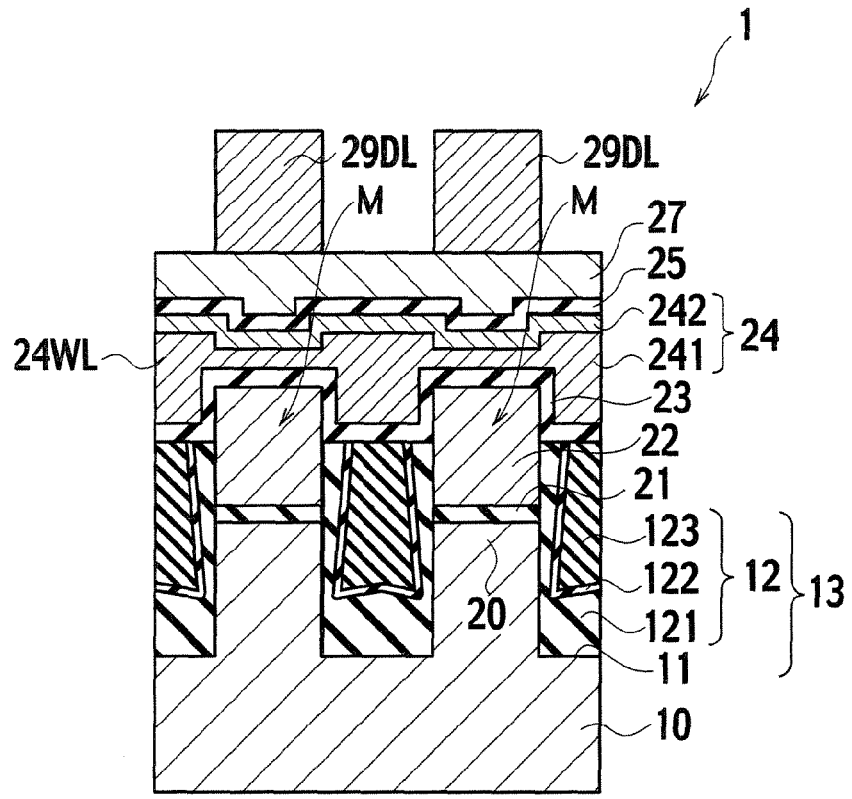
FIG. 1 is a cross section showing essential portions of a semiconductor device (i.e. a cross section taken along line F1-F1 shown in FIG. 3) according to an embodiment of the invention.
Figure 2:
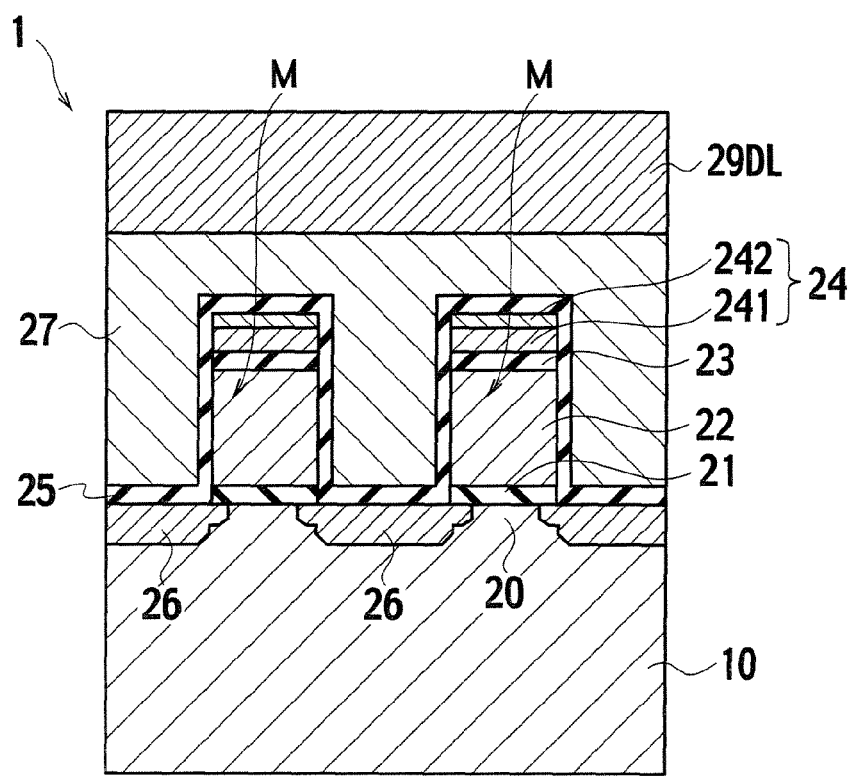
FIG. 2 is a cross section showing another essential portions of the semiconductor device shown in FIG. 1 (i.e. a cross section taken along line F2-F2 shown in FIG. 3)
Figure 3:
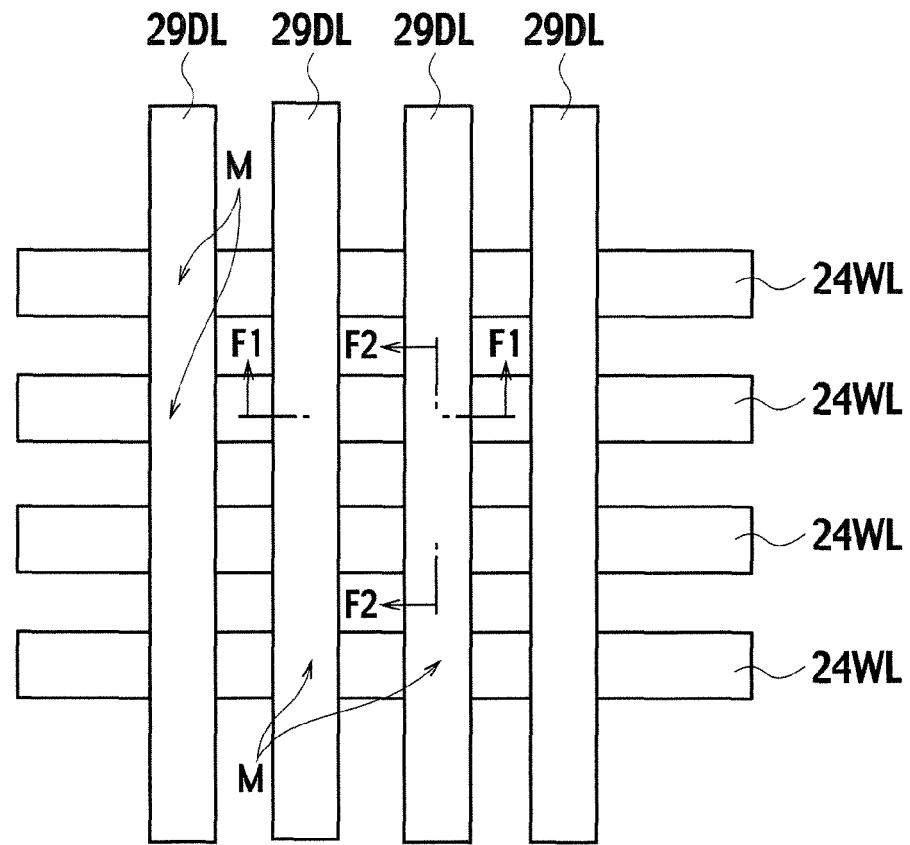
FIG. 3 is a plan view showing main portions of the semiconductor device shown in FIG. 1 and FIG. 2.

Referring to FIG. 1 to FIG. 3, a semiconductor device 1 according to one embodiment of the present invention includes a NAND type EEPROM having a non-volatile memory cell M which has a channel-forming region 20 disposed in a surface portion of a substrate 10, a first gate insulating film 21 disposed on the channel-forming region 20, a charge accumulation layer (a floating gate electrode ) 22 disposed on the first gate insulating film 21, a second gate insulating film 23 disposed on the charge accumulation layer 22, a control electrode (a control gate electrode) 24 disposed on the gate insulating film 23, a pair of main electrode regions 26 to be used as a source region and a drain region, respectively. Further, the semiconductor device 1 includes an isolation region (inter-cell isolation region) 13 which has trenches (inter-cell isolation grooves) 11 disposed on the surface of the substrate 10 so as to be opposed to each other with the channel-forming region 20 interposed therebetween and disposed in the depth direction of the substrate 10 from the surface of the substrate 10, a deposited-type insulating film 121 disposed on the surface of an inner wall of the trench 11, a coating-type insulating film 123 disposed on the surface of the deposited-type insulating film 121 and having a film density lower than that of the deposited-type insulating film 121, and an intermediate insulating film 122 disposed between the deposited-type insulating film 121 and the coating-type insulating film 123 and having an intermediate film density between the film density of the deposited-type insulating film 121 and the film density of the coating-type insulating film 123.

In the present embodiment, a single crystal silicon substrate is used for the substrate 10. A NAND type EEPROM is mounted on the primary surface portion of the substrate 10 or on the primary surface portion of the well region disposed on the primary surface portion of the substrate 10. Alternatively, a SOI (silicon on insulator) substrate in which a semiconductor active region is disposed on a single crystal silicon substrate via an insulating layer can be used for the substrate 10. In the case of the SOI substrate, a NAND type EEPROM can be mounted on the semiconductor active region thereof. Further, a NAND type EEPROM may be mounted on the substrate as a single circuit (or a unit) or may be mounted on the substrate along with other logic circuits or memory circuits.

A non-volatile memory cell M of the NAND type EEPROM stores information of 1 bit. Referring to FIG. 3, the non-volatile memory cells M are arranged at the respective intersections between a plurality of word lines 24WL extending in the lateral direction and disposed regularly so as to be spaced from each other and a plurality of data lines 29DL extending in the vertical direction and disposed regularly so as to be spaced from each other. A main electrode region 26 of a certain non-volatile memory cells M is common with main electrode regions 26 of other non-volatile memory cells M which are adjacent in the vertical direction, so that these plural non-volatile memory cells M form an element array. This element array stores information of byte, for example. One end of the element array is connected with the data line 29D through a select element which is not shown and the other end of the element array is connected to the source line similarly through a select element which is not shown. The word line 24WL is connected to each non-volatile memory element M of the element array.

The first gate insulating film 21 of the non-volatile memory cell M is also used as a tunnel insulating film, and is formed by a silicon oxide film, for example. The charge accumulation layer 22 accumulates a charge which determines a threshold voltage for controlling conduction or non-conduction of the electric current flowing in the non-volatile memory cell M. Specifically, the charge accumulation layer 22 accumulates a charge corresponding to information "0" or information "1". This charge accumulation layer 22 is formed by a poly-crystalline silicon film, for example.

In the present embodiment, a composite film formed by sequentially layering a silicon oxide film, a silicon nitride film, and a silicon oxide film is used as the second gate insulating film 23. Further, in the present embodiment, a layered film formed by a poly-crystalline silicon film 241 and a refractory silicide film 242 such as a tungsten silicide film, which is layered on a surface of the poly-crystalline silicon film 241 is used as the control electrode 24.

As shown in FIG. 2, the insulating film 25 is disposed along the side surfaces of the charge accumulation layer 22, the side surfaces of the second gate insulating film 23, the side surfaces of the control electrode 24, and the upper surface of the control electrode 24. As this insulating film 25, a silicon nitride film having a dense film quality formed by the plasma CVD method, for example, is used. This insulating film 25 is capable of preventing leakage of the charge accumulated in the charge accumulation layer 22 and of enhancing the charge storing characteristics of the non-volatile memory cell M. The word line 24WL is formed by the same conductive layer as the control electrode 24 and is formed integrally with the control electrode 24.

In the present embodiment, a pair of main electrode regions 26 is formed by a n-type semiconductor region. Accordingly, the non-volatile memory cell M is constructed by a n-channel conductivity type field effect transistor having the charge accumulation layer 22. Here, while in the present embodiment, the main electrode region 26 is formed by a single dispersion structure, the main electrode region 26 may alternatively be formed by a LDD (Lightly Doped Drain) structure.

The data line 29DL is disposed on the non-volatile memory cell M via an interlayer insulating film 27, and is connected with the select element through a connection hole (not shown) formed in the interlayer insulating film 27. A single layer of an aluminum alloy film, for example, or a composite film in which a barrier metal film or an anti-reflection film is layered on the aluminum film can be used as the data line 29DL.

The trenches 11 in the isolation regions 13 are disposed to be spaced from each other in the lateral direction and extend in the vertical direction in FIG. 3, such that they define the channel width in the channel region 20 of the non-volatile memory cell M. The position of the side wall of the trench 11 and the position of the side wall of the charge accumulation layer 22 substantially coincide with each other, so that these side walls, when viewed from right above in the direction orthogonal to the primary surface of the substrate 10, are aligned on a single line.

Inside the trench 11 in the isolation region 13, a filler 12 formed by sequentially layering a deposited-type insulating film 121, an intermediate insulating film 122, and a coating-type insulating film 123 in this order is buried. In the filler 12, the deposited-type insulating film 121 is formed of a silicon oxide film formed by the HDP-CVD method, for example, and has an extremely dense film quality. For example, a silicon oxide film formed by the HDP-CVD method has a film density within a range of 2.3 g/cm$^3$ to 2.4 g/cm$^3$. This deposited-type insulating film 121 can basically be formed to have a relatively uniform thickness along the uneven surface of the foundation layer. As the trench 11 of the present embodiment has a great aspect ratio of 4 or greater, the thickness of the deposited-type insulating film 12 is smaller on the side walls of the trench 11 than on the bottom surface of the trench 11.

The intermediate insulating film 122 is formed of a silicon oxide film formed by the HDP-CVD method, for example, though the film formation condition of the intermediate insulating film 122 slightly differs from that of the deposited-type insulating film 121. In the present embodiment, the intermediate insulating film 122 is a silicon deposited-type insulating film. This intermediate film 122, which has been formed, is subject to OH termination. The OH termination refers to a process in which oxygen (O) or hydrogen (H) which facilitates conversion into oxygen is bonded to dangling bonds of silicon (Si). The intermediate insulating film 122 to which this OH termination has been applied can enhance its adhesiveness to the coating-type insulating film 123 to be formed on the intermediate insulating film 122.

The coating-type insulating film 123 is formed by first coating a liquid material obtained by dissolving polysilazane in an organic solvent using the spin-on-glass method and then drying the coated liquid material. As polysilazane, poly (perhydrosilazane) expressed by a structure formula —[SiH2NH]n- (wherein n represents a natural number) can be practically use. Further, polysilazane can be one which is expressed by a structure formula —[SiR1R2-NR3]m- (wherein m represents a natural number) with a side chain R1, R2 or R3 having —CH$_3$, —CH=CH$_2$, or —OCH$_3$. As the organic solvent, aromatic compounds or aliphatic compounds, more specifically, benzene, toluene, xylene, diethyl ether, dibutyl ether, or the like can be practically used. On the contrary, water or alcohols are not desirable as the organic solvent due to their reaction. Also, water in which ketone and esters are dissolved is not desirable for the organic solvent. The coating-type insulating film 123, which uses a liquid material, is especially optimal as a filler which reliably fills the interior portion of the trench 11 having a great aspect ratio, and the surface of the coating-type insulating film 123 can be advantageously planarized. The coating-type insulating film 123 has a film density in the range of 1.5 g/cm$^3$ to 2.2 g/cm$^3$.

Further, though not shown in the figures, a final passivation film is further disposed on the data line 29DL.

[Manufacturing Method of Semiconductor Device, NAND type EEPROM and Isolation Region]

A manufacturing method of the above-described semiconductor device 1, namely, a method of manufacturing a NAND type EEPROM and an isolation region will be described.

First, a substrate 10 is provided. As the substrate 10, a single crystal silicon substrate can be practically used as described above.

Figure 4:
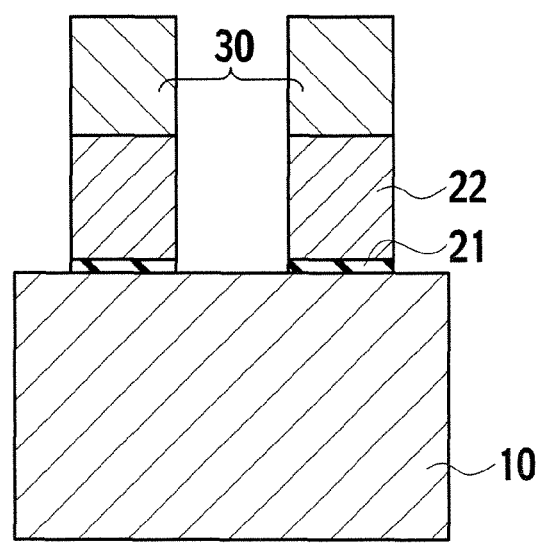
FIG. 4 is a cross section showing a first process of manufacturing.

Then, in a region on the primary surface of the substrate where the NAND type EEPROM is to be formed, a first gate insulating film 21, a charge accumulation layer 22, and a manufacturing mask 30 are sequentially layered, as shown in FIG. 4, to thereby perform patterning for determining the channel width of the non-volatile memory cell M (or the dimension of the isolation region 13). For example, as the first gate insulating film 21, a silicon oxide film formed by the thermal oxidation method is formed to have a thickness of approximately 8 nm to 12 nm. As the charge accumulation layer 22, a polycrystalline silicon film formed by the CVD method is formed to have a thickness of approximately 80 nm to 120 nm. In this patterning process, of the dimensions of the channel width and the channel length of the charge accumulation layer 22, the channel width dimension is determined, and the channel accumulation layers 22 of other non-volatile memory cells M that are adjacent in the channel length direction are connected with each other. The manufacturing mask 30 is used for an etching mask for forming the trench 11, an etching stopper mask or an etching mask which is used for filling the filler 12 in the trench 11, and so on. As this manufacturing mask 30, a silicon nitride film (SiN film) formed by the CVD method, for example, is provided at a thickness of approximately 50 nm to 100 nm.

Figure 5:
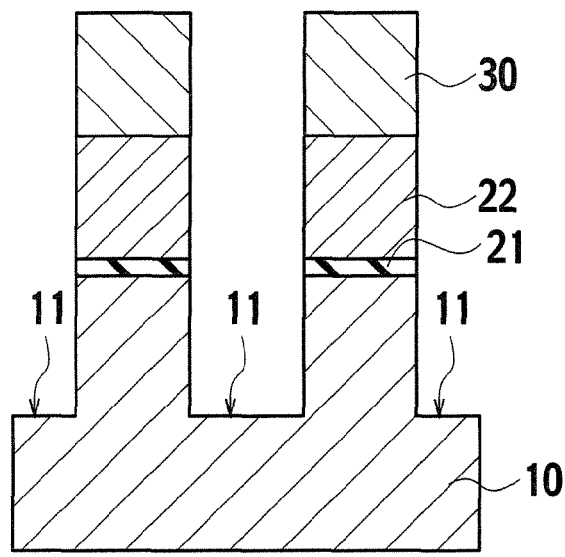
FIG. 5 is a cross section showing a second process of manufacturing.

As shown in FIG. 5, etching is performed using the manufacturing mask 30 from the surface of the substrate which is exposed, in the depth direction of the substrate 10, thereby forming the trench 11. For example, the dimension of the opening of the trench 11 in the same direction as the channel width direction is set to approximately 80 nm to 120 nm, and the depth of the trench 11 from the surface of the substrate 10 is set to approximately 200 nm to 300 nm. For formation of the trench 11, anisotropic etching such as RIE (Reactive Ion Etching) can be practically used.

Figure 6:
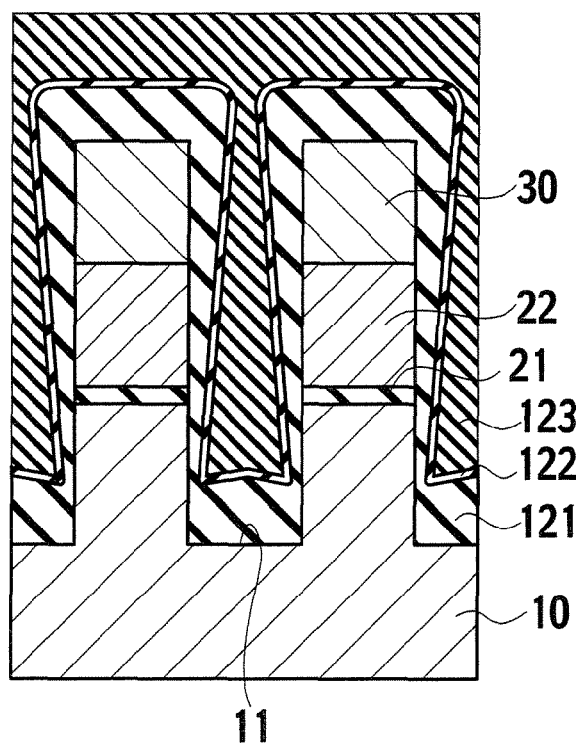
FIG. 6 is a cross section showing a third process of manufacturing.

As shown in FIG. 6, over the entire region of the primary surface of the substrate 10, namely over all the region on the side surfaces of the first gate insulating film 21, the side surfaces of the charge accumulation layer 22, the upper and side surfaces of the manufacturing mask 30, and the inner wall surfaces and bottom surface of the trench 11, the deposited-type insulating film 121 is formed, and subsequently, the intermediate insulating film 122 and the coating-type insulating film 123 are sequentially formed on the deposited-type insulating film 121.

As the deposited-type insulating film 121, a silicon oxide film having a dense film quality which is formed by the HDP-CVD method can be practically used. This silicon oxide film is formed to have a thickness of 20 nm to 30 nm. The thickness of the deposited-type insulating film 121 is set to be smaller than a half the dimension of the opening of the trench 11 in the same direction as the channel width direction, so that generation of a cavity within the trench resulting from the overhang phenomenon in which the thickness of the film formed around the shoulder portion of the manufacturing mask 30 becomes greater than that formed in other portions can be prevented. With the HDP-CVD method, the higher the plasma density, the higher dissolution efficiency for the film forming material gas can be achieved, so that Si—OH groups and H—OH groups existing in the deposited-type insulating film 121 can be decreased. The plasma density can be set within a range of approximately $10^{10}$ atoms/cm$^3$ to $10^{12}$ atoms/cm$^3$.

As the intermediate insulating film 122, a silicon oxide film, which is formed by the HDP-CVD method as with the deposited-type insulating film 121, can be practically used. This silicon oxide film is formed, subsequent to the formation of the deposited-type insulating film 121, within the same chamber as used for forming the deposited-type insulating film 121, by changing the film forming condition, more specifically by decreasing the plasma density. With the plasma density decreased, the Si—OH groups can be increased, so that the film density can be lowered. In other words, a decrease in the plasma density causes OH termination in the intermediate insulating film (silicon oxide film) 122 in which oxygen or hydrogen is supplied to the dangling bonds of the intermediate insulating film 122. This silicon oxide film is formed to have a thickness of approximately 8 nm to 12 nm, for example.

The coating-type insulating film 123 is formed by coating, using the spin-on-glass method, a liquid material obtained by dissolving polysilazane, for example, in an organic solvent. The liquid material is coated to a film thickness that can fill a step shape having a dimension corresponding to the total thickness obtained by summing the depth of the trench 11, the thickness of the first gate insulating film 21, the thickness of the charge accumulation layer 20, and the thickness of the manufacturing mask 30 and that can planarize the film surface. In a NAND-type EEPROM, in particular, because the interval between a non-volatile memory cell M and another non-volatile memory cell M adjacent thereto in the channel width direction is small and the depth of the trench 11 is apparently increased by the thickness corresponding to the thickness of the charge accumulation layer 22 and the thickness of the manufacturing mask 30, such a liquid material is optimal as a filler that can reliably fill the trench having such a high aspect ratio. The liquid material that is coated is then subjected to a pre-baking process at a temperature of 150° C. for 3 minutes by a hot plate, dried, and then heated, thereby converting the liquid material into an oxide film (e.g. a polysilazane film). Thereafter, a heat treatment at the temperature range between 200° C. and 1000° C. is performed within a $H_2O$ atmosphere, a $O_2$ atmosphere, or a $N_2$ atmosphere, to convert polysilazane into a silicon oxide film, thereby forming the coating-type insulating film 123.

Figure 7:
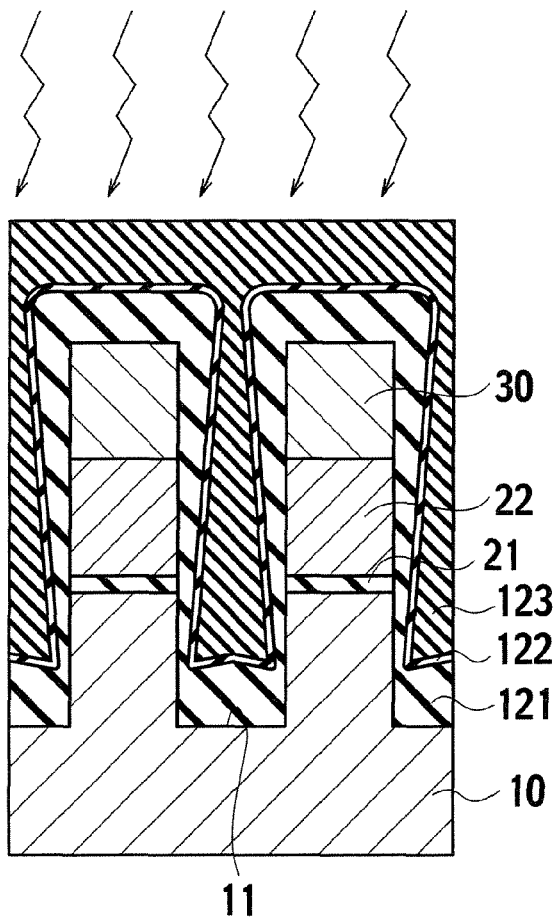
FIG. 7 is a cross section showing a fourth process of manufacturing.

Subsequently, as shown in FIG. 7, a megasonic process is applied to the coating-type insulating film 123. The megasonic process is a washing treatment which utilizes bubbles generated by using ultrasound vibration of megahertz. With the megasonic process applied to the coating-type insulating film 123, the tensile stress within the silicon oxide film generated due to film shrinkage at the time of conversion from polysilazane into the silicon oxide film can be decreased, so that generation of crack in the silicon oxide film can be prevented.

Figure 8:
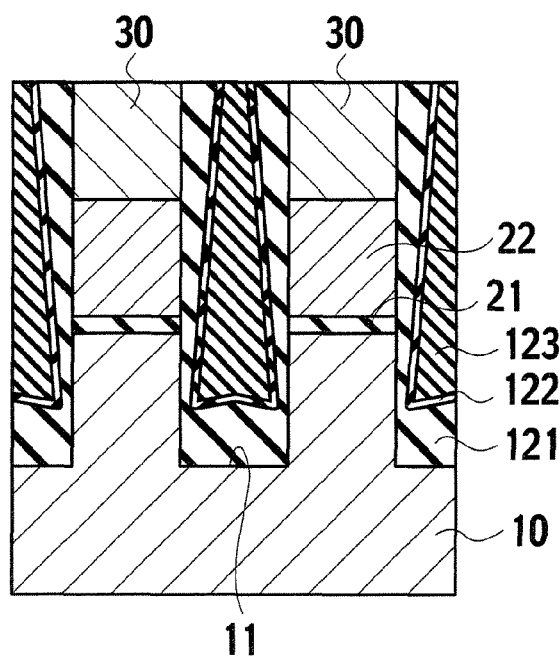
FIG. 8 is a cross section showing a fifth process of manufacturing.

Then, as shown in FIG. 8, a chemical mechanical polishing (CMP) treatment is applied to the entire surface on the substrate 10, such that the coating-type insulating film 123, the intermediate insulating film 122, and the deposited-type insulating film 121 formed on the manufacturing mask 30 are partially removed until the surface of the manufacturing mask 30 is exposed. At the same time, the remaining portions of the coating-type insulating film 123, the intermediate insulating film 122, and the deposited-type insulating film 121 are buried inside the trench 11 and between the charge accumulation layers 22 adjacent to each other in the channel width direction, and the height of the surface of the coating-type insulating film 123 and the height of the surface of the manufacturing mask 30 are set at the same level, so that the surfaces of the insulating film 123 and the manufacturing mask 30 can be planarized. Subsequently, a heat treatment is performed in a N2 atmosphere, so that the deposited-type insulating film 121, the intermediate insulating film 122, and the coating-type insulating film 123 are baked.

Thereafter, with the manufacturing mask 30 being used as an etching mask, portions of the deposited-type insulating film 121, the intermediate insulating film 122, and the coating-type insulating film 123 that are buried between the charge accumulation layers 22 in the upper portion of the trench 11 are removed by etching. Upon termination of this etching process, an isolation region 13 including the trench 11 and the filler 12 which fills the interior of the trench 11 and including the deposited-type insulating film 121, the intermediate insulating film 122, and the coating-type insulating film 123 is completed. (See FIG. 9) For etching, wet etching using a buffered hydrofluoric (HF) solution is used, and the etching depth is restricted within the thickness of charge accumulation layer 22. In other words, etching is performed within the range in which a portion of the side surface of the charge accumulation layer 22 is exposed.

Figure 9:
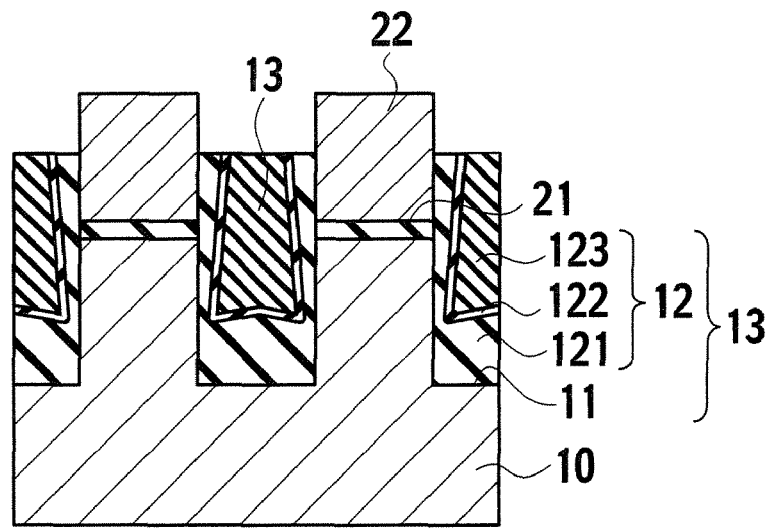
FIG. 9 is a cross section showing a sixth process of manufacturing.

Then, as shown in FIG. 9, the manufacturing mask 30 is removed. For removal of the manufacturing mask 30, a phosphoric acid solution can be used.

Further, a second gate insulating film 23 is formed at least on the surface (the upper surface and side surface) of the charge accumulation layer 22. As described above, a composite film formed by sequentially layering a silicon oxide film, a silicon nitride film, and a silicon oxide film, for example, is used as the second gate insulating film 23.

Figure 10:
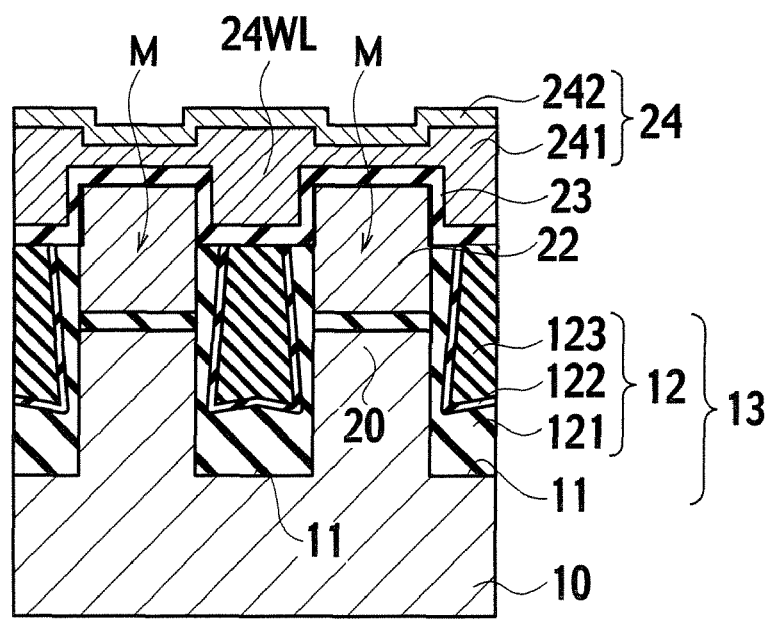
FIG. 10 is a cross section showing a seventh process of manufacturing.

Then, as shown in FIG. 10, a control electrode 24 is formed on the charge accumulation layer 22 via the second gate insulating film 23, and a word line 24WL which is integrally connected with the control electrode 24 and formed by the same gate line layer is formed. For the control electrode 24 and the word line 24WL, a composite film formed by a silicon polycrystalline film 241 and a tungsten silicide film formed above the silicon polycrystalline film 231 can be practically used.

Subsequent to patterning of the control electrode 24 and the word line 24WL, these layers are cut, thereby determining the channel length of the charge accumulation layer 22 (i.e. patterning in the channel length direction is performed). Anisotropic etching such as RIE can be practically used for this patterning.

Then, in a region on the primary surface portion of the substrate 10 enclosed by the isolation region 13 and the control electrode 24, a pair of main electrode regions 26 to be used as a source region and a drain region are formed, as shown in FIG. 2 described above. The main electrode region 26 can be formed by first doping n-type impurities into the substrate 10 using the ion doping method and then activating the n-type impurities. With the formation of the main electrode regions 26, a non-volatile memory cell M can be completed (see also FIG. 2 and FIG. 3).

Further, an interlayer insulating film 27 is formed on the entire surface of the substrate 10 including the surface of the non-volatile memory cell M, and the interlayer insulating layer 27 located on the main electrode (drain region) of a select element (not shown) is removed to thereby form a connection hole. Then, a data line 29DL is formed on the interlayer insulating film 27 so as to connect with the main electrode region of the select element through the connection hole (see FIGS. 1 to 3). For the data line 29DL, a composite film including, as a main film, an aluminum alloy film formed by sputtering method, for example, can be practically used. Further, when a passivation film which is not shown is formed, the above-described NAND type EEPROM shown in FIGS. 1 to 3 is completed, whereby a semiconductor device 1 according to the present embodiment can be completed.

As described above, in the semiconductor device 1 and the manufacturing method of the semiconductor device 1 according to the present embodiment, because the intermediate insulating film 122 having a film density which is intermediate between the film densities of the deposited-type insulating film 121 and the coating-type insulating film 123 is disposed between these films, separation between the deposited-type insulating film 121 and the coating-type insulating film 123 and generation of cracks in the coating-type insulating film 123 can be prevented.

Further, with the OH termination process applied to the intermediate insulating film 122, adhesion between the intermediate insulating film 122 and the coating-type insulating film 123 can be increased, so that separation between the deposited-type insulating film 121 and the coating-type insulating film 123 and generation of cracks in the coating-type insulating film 123 can be further prevented.

Also, because the megasonic process is applied to the coating-type insulating film 123, the internal stress of the coating-type insulating film 123 can be reduced. Consequently, separation between the deposited-type insulating film 121 and the coating-type insulating film 123 and generation of cracks in the coating-type insulating film 123 can be further prevented.

These operational advantages according to the present embodiment as described above are notable when the present invention is applied to a NAND type EERPOM in which the height of the filler 12 in the isolation region 13 is increased by the dimension corresponding to the total thicknesses of the first gate insulating film 21, the charge accumulation layer 22, and the manufacturing mask 30, in addition to the depth of the trench 11 (i.e. the aspect ratio at the time of filling the filler 12 is large). Accordingly, in the semiconductor device 1 having such a NAND type EEPROM, high integration and large memory capacity can be achieved.

In the above embodiment, it is also possible to form the coating-type insulating film 123 after the deposited-type insulating film 121 is formed as described above, with the intermediate insulating film 122 not being interposed, and then apply the megasonic process to the coating-type insulating film 123. In this case, separation between the deposited-type insulating film 121 and the coating-type insulating film 123 and generation of cracks in the coating-type insulating film 123 can be prevented, without interposing the intermediate insulating film 122.

Other Embodiments

The present invention is not limited to the specific embodiment described above, and it will be understood by those skill in the art that various other modifications are possible within the spirit and scope of the present invention. For example, while in the foregoing embodiment, an example in which the present invention is applied to a semiconductor device including a NAND type EEPROM has been described, the present invention is also applicable to a semiconductor device including an isolation region which separates cells of a memory device other than a NAND type EEPROM, a semiconductor device including an isolation region which separates logic cells, and so on.

What is claimed is:

1. A method of manufacturing a semiconductor device, the method comprising:
depositing a first insulating film having a first film density on a substrate;
forming a second insulating film having a second film density on the first insulating film by depositing a silicon insulating film on the first insulating film with a deposition condition to increase Si—OH groups in the silicon insulating film compared to the first insulating film;
coating an insulating film material in which polysilazane is dissolved on the second insulating film; and
applying a heat treatment to the insulating film material to form a silicon oxide film having a third film density, wherein the second film density is less than the first film density and larger than the third film density.

2. The method of manufacturing a semiconductor device according to claim 1, further comprising:
applying a megasonic process to the silicon oxide film.

3. The method of manufacturing a semiconductor device according to claim 1, wherein said depositing is carried out by a first high density plasma-chemical vapor deposition, and said forming is carried out by a second high density plasma-chemical vapor deposition with a lower plasma density than the plasma density of the first high density plasma-chemical vapor deposition.

4. The method of manufacturing a semiconductor device according to claim 3, wherein a plasma density of the first high density plasma-chemical vapor deposition is in a range of approximately $10^{10}$ atoms/cm$^3$ to $10^{12}$ atoms/cm$^3$.

5. The method of manufacturing a semiconductor device according to claim 1, wherein the first film density is 2.3 g/cm$^3$ to 2.4 g/cm$^3$, and the third film density is 1.5 g/cm$^3$ to 2.2 g/cm$^3$.

6. The method of manufacturing a semiconductor device according to claim 1, wherein the second insulating film is deposited to have a thickness less than the first insulating film.

7. The method of manufacturing a semiconductor device according to claim 1, wherein said polysilazane is expressed by —[SiR1R2-NR3]m- where m represents a natural number and each of R1, R2 and R3 is a side chain having —CH$_3$, —CH=CH$_2$ or —OCH$_3$.

* * * * *